(12) United States Patent
Iiyama et al.

(10) Patent No.: US 6,772,953 B2
(45) Date of Patent: Aug. 10, 2004

(54) CONTACTLESS DATA CARRIER

(75) Inventors: Keiichi Iiyama, Osaka (JP); Takashi Noda, Hyogo (JP); Shinji Murakami, Kyoto (JP); Yutaka Harada, Kyoto (JP); Takuya Oka, Osaka (JP); Masaru Tanichi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 51 days.

(21) Appl. No.: 09/775,185

(22) Filed: Feb. 1, 2001

(65) Prior Publication Data

US 2002/0017569 A1 Feb. 14, 2002

(30) Foreign Application Priority Data

Feb. 3, 2000 (JP) .......................................... 2000-025949

(51) Int. Cl.$^7$ .............................................. G06K 19/06
(52) U.S. Cl. ......................................... 235/492; 235/488
(58) Field of Search ................................. 361/737, 758; 235/492, 486, 488, 472.01, 472.02

(56) References Cited

U.S. PATENT DOCUMENTS

| | | | | |
|---|---|---|---|---|
| 5,416,358 A | * | 5/1995 | Ochi et al. ................... | 257/675 |
| 5,539,148 A | * | 7/1996 | Konishi et al. ............ | 174/35 R |
| 5,773,812 A | * | 6/1998 | Kreft ........................... | 235/492 |
| 5,809,633 A | * | 9/1998 | Mundigl ...................... | 235/380 |
| 5,837,992 A | * | 11/1998 | Onozawa ..................... | 235/488 |
| 5,880,934 A | * | 3/1999 | Haghiri-Tehrani ........... | 235/492 |
| 5,942,351 A | * | 8/1999 | Van Lerberghe ............. | 429/55 |
| 5,969,951 A | * | 10/1999 | Fischer et al. ............... | 235/492 |
| 6,321,993 B1 | * | 11/2001 | Riener et al. ................ | 235/492 |

* cited by examiner

Primary Examiner—Daniel St. Cyr
(74) Attorney, Agent, or Firm—Merchant & Gould P.C.

(57) ABSTRACT

An electronic circuit module formed of an antenna coil and an integrated circuit provided on a circuit board is provided inside a hollow resin case formed of a first part and a second part. A first slit leading into the hollow portion is provided in one side face of the resin case formed of the first and second parts joined to each other. Since the electronic circuit module is not exposed to high temperatures and high pressure during the manufacturing process, defects such as the breakage of the integrated circuit or the disconnection of the antenna coil can be avoided. Since the slit leading into the hollow portion is provided, the hollow portion does not swell by the temperature increase. In addition, pinholes do not tend to be formed during the joining of the first and second parts. Thus, a contactless data carrier with an excellent electrostatic withstand voltage characteristic can be provided.

4 Claims, 5 Drawing Sheets

CONTACTLESS DATA CARRIER

BACKGROUND OF THE INVENTION

1. Field of the Invention

The present invention relates generally to a contactless data carrier that is attached to various products, is used for a merchandise or process control by storing ID numbers or merchandise characteristics, and communicates with an interrogator on an electromagnetic induction system without requiring any electric contact point.

2. Related Background Art

Recently, contactless data carriers, such as tags or IC cards including IC chips with the required circuits integrated therein for thickness and size reductions, have been developed that transmit/receive data or supply/receive power using electromagnetic induction coupling or the like without using electric contact points. Besides the characteristics of having a high storage capacity and an advanced security function, the contactless data carriers have characteristics that, for example, communication can be carried out simply by inserting the tags or IC cards themselves into slots or bringing them close to an antenna part of a reader-writer. Hence, the contactless data carriers require no mechanical part such as contact points and thus are maintenance-free. Consequently, they can be attached to removable components used in equipment or used for merchandise or process control and allow the components to be controlled or to be used under optimum conditions. Such a contactless data carrier transmits information to and receives information from an interrogator as a reader-writer using a medium such as a radio wave. The electric power required for the operations of a control circuit and a memory unit of the contactless data carrier is obtained through rectification of an induced current generated by an electromagnetic induction operation in a coil provided inside the contactless data carrier by a radio wave transmitted from the interrogator.

A configuration of a conventional contactless data carrier is described with reference to FIG. 7.

As shown in FIG. 7, a conventional contactless data carrier has a configuration in which an electronic circuit module including an antenna coil 2 and an integrated circuit 4 placed on a circuit board 3 is provided inside a resin case 1 and a sheet-like resin case 5. The integrated circuit 4 includes a diode circuit, a demodulator circuit, a power circuit, a modulation circuit, and a memory and control circuit.

The antenna coil 2 is produced with a copper wire wound a plurality of times in a rectangular or circular shape. The integrated circuit 4 used for controlling communication with an interrogator (not shown in the figure) is bonded to the circuit board 3 and is connected electrically to the antenna coil 2 on the circuit board 3. FIG. 7 shows a schematic view of the antenna coil 2 formed of a bundled coil.

Conventionally, the resin case 1 of the contactless data carrier generally is formed by injection molding of molding resin. This is carried out by injection molding in the following procedure. That is, the antenna coil 2 and the circuit board 3 with the integrated circuit 4 mounted thereon are placed on the sheet-like resin case 5, this resin case 5 is inserted into a cavity of a molding die, and then resin is injected into the die.

In this case, the resin case 1 is molded to be packaged as a part of the contactless data carrier. In order to prevent positional shifts from being caused by the pressure of the molding resin when the resin is injected into the die, the antenna coil 2 and the circuit board 3 may be fixed to the sheet-like resin case 5 by pasting or the like in some cases.

However, in the conventional manufacturing method by injection, the integrated circuit 4, the circuit board 3, and the antenna coil 2 are exposed to high temperatures and high pressure of the molding resin in the molding step. As a result, defects such as breakage of the integrated circuit 4, disconnection of the antenna coil 2, or the like may occur in some cases.

In addition, it was difficult to carry out the molding without causing a pinhole between the sheet-like resin case 5 and the resin case 1. When the pinhole is in contact with the antenna coil 2 or the integrated circuit 4 of the electronic circuit module, the electrostatic withstand voltage characteristic cannot be secured reliably, which has been a problem.

SUMMARY OF THE INVENTION

The present invention solves the above-mentioned problems. It is an object of the present invention to provide a contactless data carrier, having an excellent electrostatic withstand voltage characteristic, and whose interior is not exposed to high temperatures and high pressure in molding the contactless data carrier.

In order to solve the aforementioned problems, a contactless data carrier of the present invention includes an electronic circuit module contained in a hollow resin case provided with a first slit. The electronic circuit module includes an antenna coil and an integrated circuit electrically connected to each other.

According to this configuration, since the electronic circuit module is contained inside the hollow resin case, the integrated circuit and the antenna coil are not exposed to high temperatures and high pressure in forming the contactless data carrier as in the injection molding. Therefore, defects such as the breakage of the integrated circuit or the disconnection in the antenna coil can be avoided. In addition, since the first slit leading into the hollow portion inside the resin case is provided, it is possible to prevent the occurrence of the problem that the resin case swells due to the increase in air pressure inside the resin case under a high temperature state and thus the registration between the outer face of the resin case and an antenna coil of a reader-writer deteriorates and the communication characteristics deteriorate accordingly. Furthermore, since the slit is provided in the hollow resin case, the pressure inside the case does not increase, so that pinholes do not tend to be formed during the fusion of the resin case and thus the electrostatic withstand voltage characteristic can be improved.

Preferably, the contactless data carrier of the present invention further includes a shielding plate provided between the electronic circuit module and the first slit, and the shielding plate is provided with a second slit.

According to this configuration, the creeping distance from the first slit to the electronic circuit module can be increased, so that the electrostatic withstand voltage performance further can be improved.

Preferably, in the contactless data carrier according to the present invention, the antenna coil and the integrated circuit are provided on a single board.

With this configuration, an electronic circuit module with the antenna coil, integrated circuit, and board combined to form one unit can be configured. Thus, the fixing of the electronic circuit module to the resin case can be facilitated.

In the contactless data carrier according to the present invention, it is preferable that the resin case is formed by allowing a first part and a second part to join each other and the first slit is provided in a portion where the first part and the second part join each other.

According to this configuration, a cut portion is preformed in the first part or the second part and thus the first slit can be provided in the resin case easily.

In the contactless data carrier according to the present invention, it is preferable that the electronic circuit module is positioned close to one face inside the resin case and the first slit is provided in a face opposing the one face of the resin case.

With this configuration, the position of the first slit can be kept away from the electronic circuit module, so that the electrostatic withstand voltage characteristic can be improved.

Furthermore, in the contactless data carrier according to the present invention, it is preferable that a plurality of shielding plates are provided between the electronic circuit module and the first slit and each of the shielding plates is provided with a slit.

According to this configuration, since the creeping distance from the first slit to the antenna coil can be increased, the electrostatic withstand voltage characteristic can be improved.

BRIEF DESCRIPTION OF THE DRAWINGS

FIG. 4A is its sectional side view and FIG. 4B is its sectional plan view.

FIGS. 5A and 5B are a sectional side view and a sectional plan view, respectively.

DETAILED DESCRIPTION OF THE INVENTION

Embodiments of contactless data carriers according to the present invention are described in detail with reference to the drawings.

First Embodiment

Figure 1:
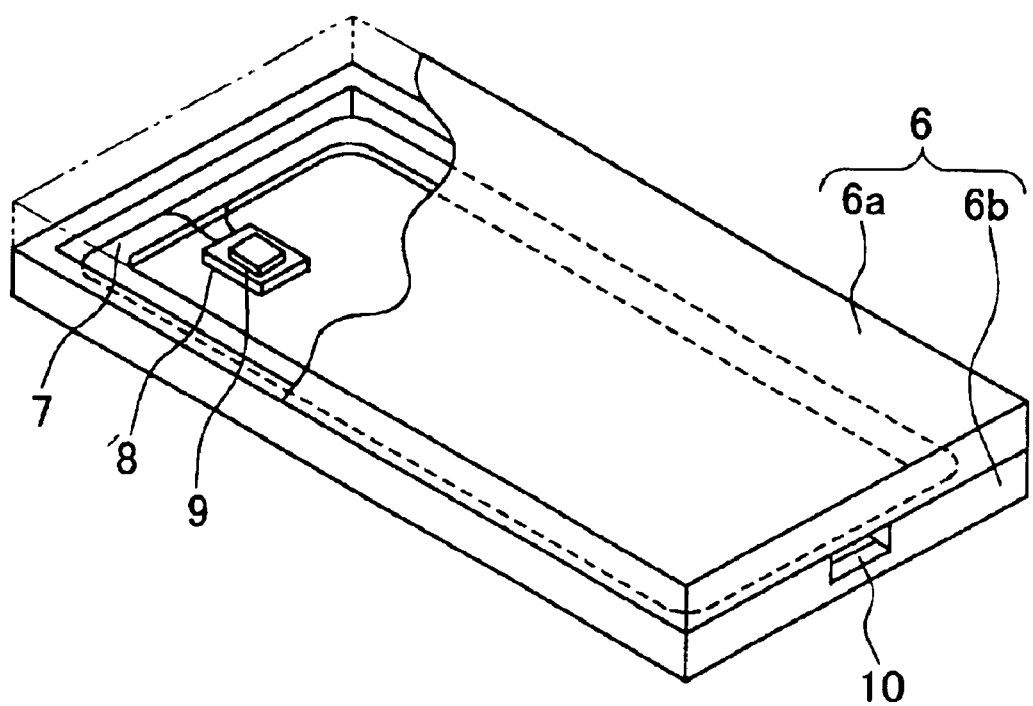
FIG. 1 is a partially cutaway perspective view of a contactless data carrier according to a first embodiment of the present invention.

FIG. 1 shows a partially cutaway perspective view of a contactless data carrier according to a first embodiment of the present invention.

As shown in FIG. 1, the contactless data carrier is provided with an electronic circuit module in a hollow defined by a resin case 6. The electronic circuit module includes an antenna coil 7 and an integrated circuit 9 placed on a circuit board 8 on the surface of which circuit wiring can be formed. The resin case 6 is formed of a first part 6a and a second part 6b each of which has a shape of a box with no top, and the second part 6b is provided with a cut portion in its side face. In one side face of the resin case 6 formed with the first part 6a and the second part 6b joined to each other, a first slit 10 leading into the hollow portion is provided by the cut portion formed in the second part 6b. The integrated circuit 9 includes a diode circuit, a demodulator circuit, a power circuit, a modulation circuit, and a memory and control circuit.

As in the conventional method, the antenna coil 7 is produced with a copper wire wound a plurality of times in a rectangular or circular shape, the integrated circuit 9 for controlling communication with an interrogator (not shown in the figure) is bonded to the circuit board 8, and the antenna coil 7 and the integrated circuit 9 are connected electrically to each other on the circuit board 8 through metal wires (not shown in the figure).

FIG. 1 shows the antenna coil 7 formed of a bundled coil.

Furthermore, in FIG. 1, a groove-like cut portion is provided on the upper end side of a side face of the second part 6b to be joined to the first part 6a to form the first slit 10. However, the present invention is not limited to such a configuration. For instance, cut portions may be provided in opposed positions in the side faces of the first and second parts 6a and 6b to form the first slit 10.

In addition, the cut portion may be provided not in the second part 6b but only in the first part 6a to form the first slit 10.

Next, the following description is directed to a process of manufacturing a contactless data carrier according to the present invention.

Initially, the electronic circuit module including the circuit board 8 provided with the integrated circuit 9 and the antenna coil 7 is placed on the bottom face of the second part 6b provided with the cut portion of the resin case 6. Then, the electronic circuit module is bonded and fixed to the second part 6b.

Subsequently, the four side faces of the first part 6a and the four side faces of the second part 6b are brought into contact, and they are bonded to each other by a method such as ultrasonic welding or the like. Thus, the first rectangular slit 10 is formed in one side face of the resin case 6 with the first part 6a and the second part 6b joined to each other. Consequently, the inside and outside of the resin case 6 are connected spatially. Thus, the configuration is obtained that allows the electronic circuit module to be contained in the hollow resin case 6.

The provision of the first slit 10 prevents, for example, the resin case 6 from swelling due to the increase in air pressure of the inside caused by a temperature increase. In the case where the resin case 6 swells, when position adjustment is carried out using the outer face of the resin case 6 and the contactless data carrier is used in a state of close contact with equipment, the position of the outer face of the resin case 6 relative to the antenna coil 7 varies only in the swelling portion. Consequently, the communication characteristics deteriorate.

In addition, the disconnection of the antenna coil 7 or the breakage of the integrated circuit 9 inside the resin case 6 caused by the distortion of the resin case 6 due to an increased air pressure also can be avoided.

Furthermore, the electronic circuit module 12 facilitates its placement on the second part 6b when using the electronic circuit module 12 with the following configuration.

Figure 2:
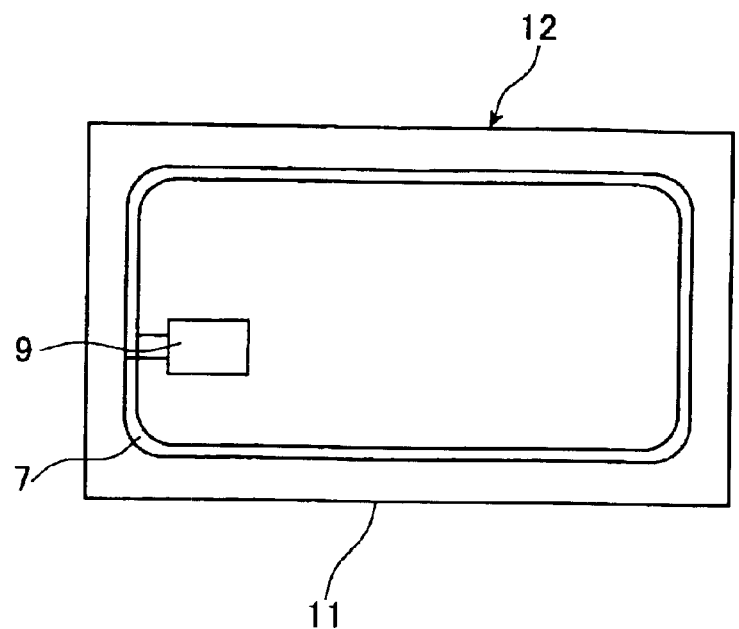
FIG. 2 is a drawing showing a configuration of an electronic circuit module according to the first embodiment of the present invention.

That is, the antenna coil 7 and the circuit board 8 are not placed directly on the concave portion of the second part 6b, but as shown in FIG. 2, the antenna coil 7 is formed on the surface of the circuit board 11 by patterning, the integrated circuit 9 is provided on the circuit board 11, and then the antenna coil 7 and the integrated circuit 9 are connected electrically to each other on the circuit board 11 through metal wires (not shown in the figure).

Figure 3:
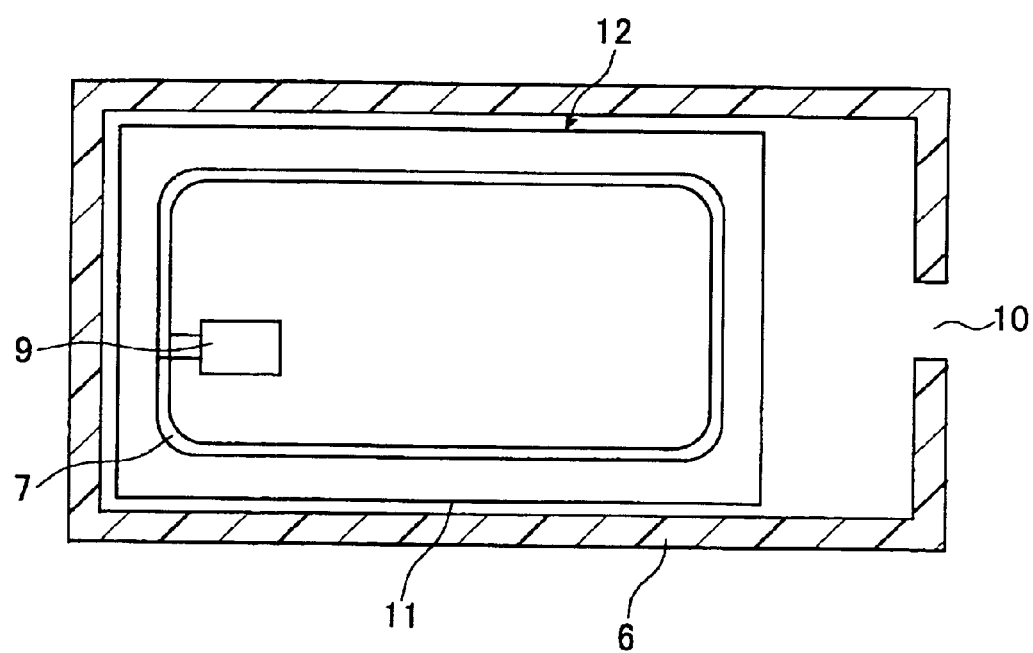
FIG. 3 is a drawing showing a layout of the electronic circuit module according to the first embodiment of the present invention.

When the first slit 10 is provided, there is a possibility that the static electricity may enter the electronic circuit module 12. As shown in FIG. 3, however, the electronic circuit module 12 is positioned close to the opposite face of the resin case 6 to the face where the first slit 10 is provided so as to be located far from the first slit 10, so that the creeping distance from the first slit 10 to the electronic circuit module 12 is increased. Thus the electrostatic withstand voltage performance can be improved.

The electrostatic withstand voltage performance varies depending on the size of the first slit 10 even when the creeping distance remains unchanged.

In the case where the contactless data carrier had a dimension of 30 mm×15 mm×4 mm (length×width×height), when this contactless data carrier was placed on a metal connected to ground and static electricity is applied thereto, an electrostatic withstand voltage of 30 kV was obtained when the dimension of the first rectangular slit 10 was set to be about 5 mm×0.2 mm (width×height).

The air pressure inside the resin case 1 also can be adjusted when the first rectangular slit 10 has a dimension of about 2 mm×0.2 mm (width×height). Therefore, the resin case 6 does not swell even when exposed to high temperatures. Thus, the electrostatic withstand voltage further was increased.

The shape of the first slit 10 viewed from its front side is not limited to the rectangular shape but may be an elliptical or circular shape. In short, any shapes may be employed as long as their sizes are in a range not allowing the resin case 6 to swell even with the exposure to high temperatures.

Second Embodiment

Figure 4A:
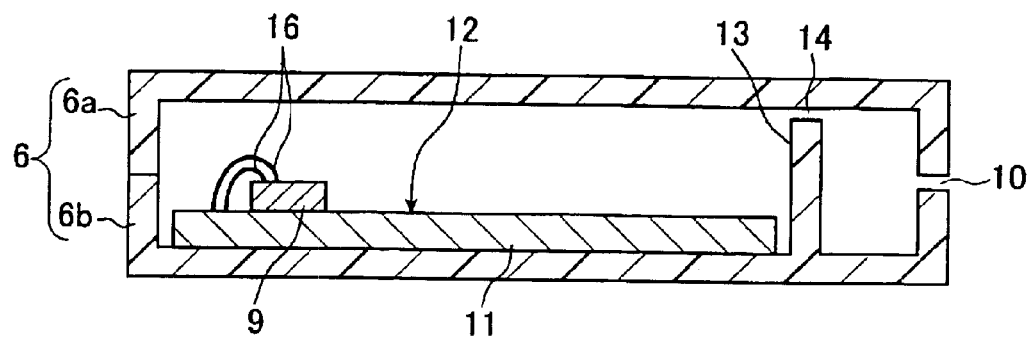
FIGS. 4A and 4B are drawings showing a contactless data carrier provided with a shielding plate according to a second embodiment of the present invention.
Figure 4B:
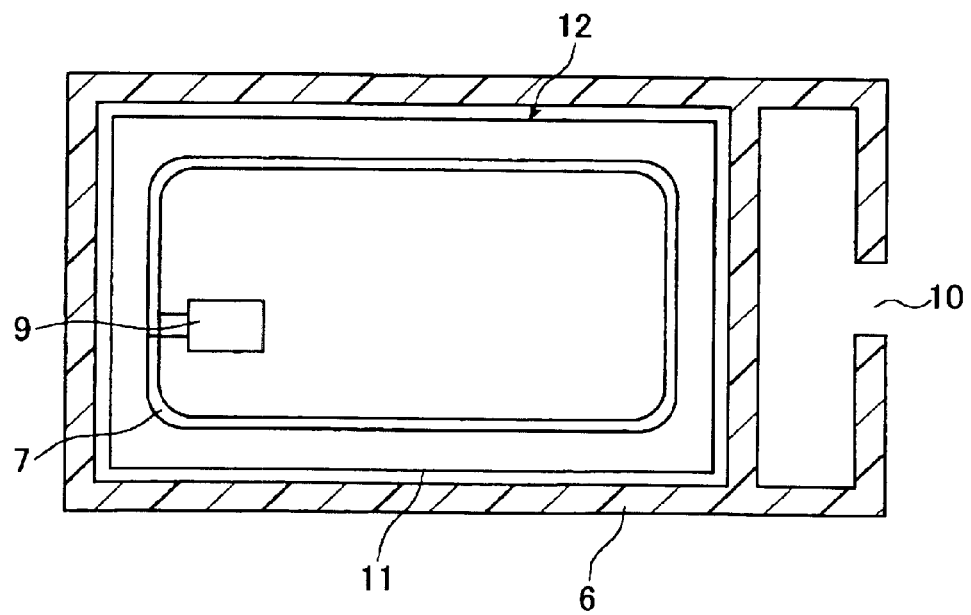

FIGS. 4A and 4B show sectional views of a contactless data carrier according to a second embodiment of the present invention.

FIGS. 4A and 4B show a sectional side view and a sectional plan view of the contactless data carrier, respectively.

As shown in FIGS. 4A and 4B, in this configuration, a shielding plate 13 made of resin provided with a second slit 14 is provided inside the resin case 6 shown in FIG. 3 and thus a space is provided between a first slit 10 provided in a part where the first and second parts 6a and 6b join each other and an electronic circuit module 12 with an antenna coil 7 and an integrated circuit 9 formed on a circuit board 11. Numeral 16 indicates metal wires for connecting the integrated circuit 9 to the antenna coil 7 on the circuit board 11. A cut portion is formed in a part of a side of the top of the shielding plate 13 as in the case where the first slit 10 is provided, and thus the second slit 14 is provided.

In FIGS. 4A and 4B, the shielding plate 13 is formed integrally with the second part 6b but may be formed integrally with the first part 6a. In addition, the second slit 14 may be formed not by the formation of the cut portion in the top of the shielding plate 13 but by the formation of a through hole in the vicinity of the center in the up-and-down direction of the shielding plate 13 in FIG. 4A. When the shielding plate 13 is formed of the same resin as that used for forming the first and second parts 6a and 6b and is provided in the same step as that for forming the first part 6a or the second part 6b, the process is simplified.

With this shielding plate 13, the second slit 14 is provided in the upper or lower portion inside the resin case 6 or in the shielding plate 13 (in the figure, the second slit 14 is produced in the upper portion). The hollow portion in which the electronic circuit module 12 is contained communicates with the outside through the second slit 14 and the first slit 10.

According to this configuration, the creeping distance of static electricity increases due to the shielding plate 13 and thus the electrostatic withstand voltage characteristic can be improved.

Figure 5A:
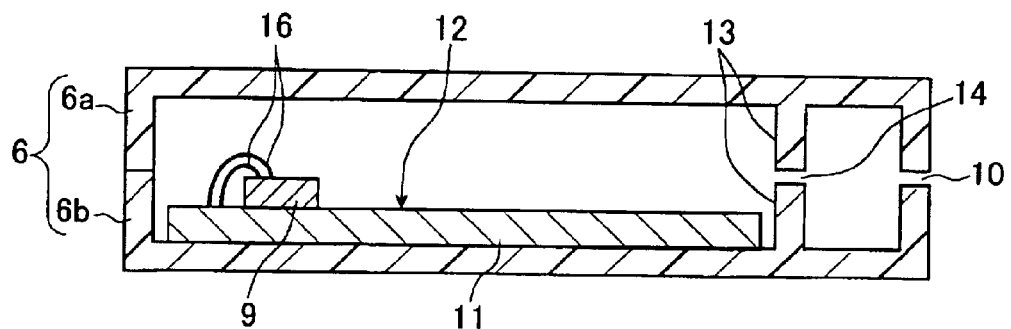
FIGS. 5A and 5B are drawings showing contactless data carriers provided with shielding plates with slits in different positions according to the second embodiment of the present invention.

As illustrated in FIG. 5A showing the sectional side view of a contactless data carrier, the second slit 14 may be produced as in the case of the first slit 10 as follows: shielding plates 13 are provided in opposed positions of the first part 6a and the second part 6b of the resin case 6 so as to extend toward each other; a cut portion is provided in a side of the top of one or each of the shielding plates 13; the sides of the tops of both the shielding plates 13 excluding the cut portion are brought into contact with each other; and then the first part 6a and the second part 6b are welded with ultrasonic waves.

Figure 5B:
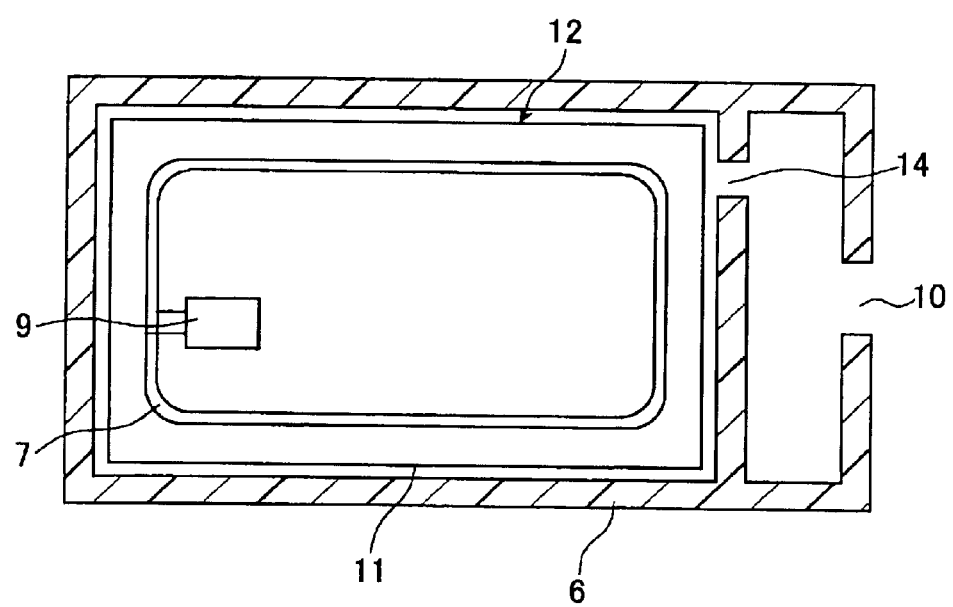

In this case, as illustrated in FIG. 5B showing the sectional plan view of a contactless data carrier, the second slit 14 and the first slit 10 are arranged in positions shifted with respect to each other (i.e. arranged not to oppose each other) when viewed from the upper side, so that the creeping distance increases and the electrostatic withstand voltage characteristic can be improved as in the case shown in FIG. 4A.

In FIG. 5B, the positions of the first and second slits 10 and 14 are shifted with respect to each other only in the horizontal direction. However, when their positions also are shifted with respect to each other in the vertical direction, the creeping distance further can be increased.

Figure 6:
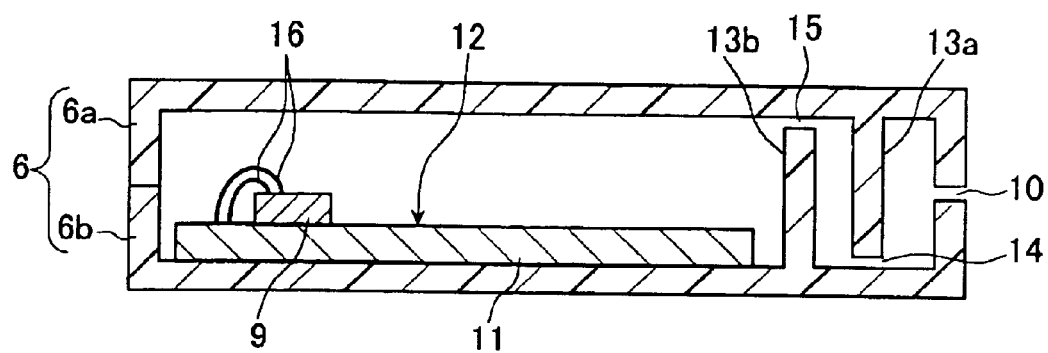
FIG. 6 is a sectional side view of a contactless data carrier provided with a plurality of shielding plates according to the second embodiment of the present invention.
Figure 7:
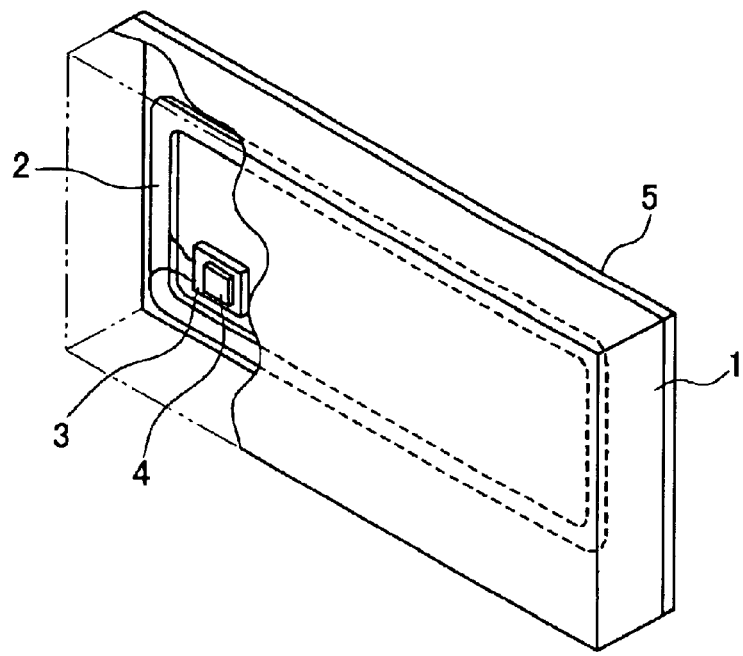
FIG. 7 is a partially cutaway perspective view of a conventional contactless data carrier.

In addition, as shown in FIG. 6, when two shielding plates 13a and 13b provided with the second slit 14 and a third slit 15, respectively, are provided between the first slit 10 and the electronic circuit module, the creeping distance further can be increased. In this case, the third slit 15 is formed in the shielding plate 13b by the same method as that used for forming the second slit 14.

FIG. 6 shows the case of using two shielding plates. However, additional shielding plates may be provided depending on the working condition. In this case, each shielding plate is provided with a slit and the arrangement of the respective slits can be set variously with consideration given to the creeping distance between the first slit 10 and the electronic circuit module as described above.

The embodiments described above merely intend to clarify technical details of the present invention and the present invention should not be interpreted as being limited to such specific examples. The present invention can be carried out by being modified variously within a range of claims and without departing from its spirit and should be interpreted broadly.

What is claimed is:

1. A contactless data carrier, comprising:
   an electronic circuit module including an antenna coil and an integrated circuit electrically connected to each other;
   a hollow resin case provided with a first slit and a hollow portion inside; and
   a shielding plate,
   wherein the electronic circuit module is contained in the hollow portion of the hollow resin case, the first slit spatially connects the hollow portion and an outside of the hollow resin case, and the shielding plate is provided in the hollow portion of the hollow resin case and between the electronic circuit module and the first slit to partition the hollow portion and is provided with a second slit, the hollow portion being on a side of the electronic circuit module with respect to the shielding plate and communicating with the outside of the hollow resin case through the second slit and the first slit.

2. A contactless data carrier, comprising:

an electronic circuit module including an antenna coil and an integrated circuit electrically connected to each other; and a hollow resin case provided with a first slit and a hollow portion inside, wherein the electronic circuit module is contained in the hollow portion of the hollow resin case, the first slit spatially connects the hollow portion and an outside of the hollow resin case, and the hollow resin case is formed by allowing a first part and a second part to join each other and the first slit is provided in a portion where the first part and the second part join each other.

3. A contactless data carrier, comprising:

an electronic circuit module including an antenna coil and an integrated circuit electrically connected to each other; and a hollow resin case provided with a first slit and a hollow portion inside, wherein the electronic circuit module is contained in the hollow portion of the hollow resin case, the first slit spatially connects the hollow portion and an outside of the hollow resin case, and the electronic circuit module is positioned close to one face inside the hollow resin case and the first slit is provided in a face opposing the one face of the hollow resin case.

4. A contactless data carrier, comprising:

an electronic circuit module including an antenna coil and an integrated circuit electrically connected to each other; and a hollow resin case provided with a first slit and a hollow portion inside, wherein the electronic circuit module is contained in the hollow portion of the hollow resin case, the first slit spatially connects the hollow portion and an outside of the hollow resin case, and a plurality of shielding plates are provided in the hollow portion of the hollow resin case and between the electronic circuit module and the first slit to partition the hollow portion, and each of the plurality of shielding plates is provided with a slit.

* * * * *